(12) United States Patent
Ogino et al.

(10) Patent No.: US 10,325,761 B2
(45) Date of Patent: Jun. 18, 2019

(54) MAGNETIC MATERIAL SPUTTERING TARGET AND MANUFACTURING METHOD THEREOF

(71) Applicant: JX Nippon Mining & Metals Corporation, Tokyo (JP)

(72) Inventors: Shin-ichi Ogino, Ibaraki (JP); Yuichiro Nakamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 54 days.

(21) Appl. No.: 15/702,777

(22) Filed: Sep. 13, 2017

(65) Prior Publication Data

US 2018/0005807 A1 Jan. 4, 2018

Related U.S. Application Data

(63) Continuation of application No. 14/358,285, filed as application No. PCT/JP2013/054849 on Feb. 26, 2013, now Pat. No. 9,793,099.

(30) Foreign Application Priority Data

Mar. 15, 2012 (JP) ................................. 2012-059383

(51) Int. Cl.
*H01J 37/34* (2006.01)
*C23C 14/34* (2006.01)
(Continued)

(52) U.S. Cl.
CPC ............ *H01J 37/3426* (2013.01); *B22F 3/15* (2013.01); *C04B 35/6455* (2013.01); *C22C 1/10* (2013.01);
(Continued)

(58) Field of Classification Search
CPC .............. C23C 14/3414; H01J 37/3414; H01J 37/3426
See application file for complete search history.

(56) References Cited

U.S. PATENT DOCUMENTS 4,476,000 A 10/1984 Nagao et al.
5,478,661 A 12/1995 Murayama et al.
(Continued)

FOREIGN PATENT DOCUMENTS

JP 07-311929 A 11/1995
JP 10-088333 A 4/1998
(Continued)

*Primary Examiner* — John J Brayton
(74) *Attorney, Agent, or Firm* — Howson & Howson LLP

(57) ABSTRACT

Provided is an oxide-containing magnetic material sputtering target wherein the oxides have an average grain diameter of 400 nm or less. Also provided is a method of producing an oxide-containing magnetic material sputtering target. The method involves depositing a magnetic material on a substrate by the PVD or CVD method, then removing the substrate from the deposited magnetic material, pulverizing the material to obtain a raw material for the target, and further sintering the raw material. An object is to provide a magnetic material target, in particular, a nonmagnetic grain-dispersed ferromagnetic sputtering target capable of suppressing discharge abnormalities of oxides that are the cause of particle generation during sputtering.

10 Claims, 8 Drawing Sheets

(51) Int. Cl.
    *G11B 5/851*       (2006.01)
    *C22C 38/00*       (2006.01)
    *C22C 33/02*       (2006.01)
    *C22C 32/00*       (2006.01)
    *C22C 19/07*       (2006.01)
    *C22C 1/10*        (2006.01)
    *B22F 3/15*        (2006.01)
    *C04B 35/645*     (2006.01)
    *C22C 27/04*      (2006.01)
    *C22F 1/10*       (2006.01)

(52) U.S. Cl.
    CPC .......... *C22C 19/07* (2013.01); *C22C 32/0021* (2013.01); *C22C 32/0026* (2013.01); *C22C 33/0278* (2013.01); *C22C 38/002* (2013.01); *C23C 14/3414* (2013.01); *G11B 5/851* (2013.01); *C22C 27/04* (2013.01); *C22C 2202/02* (2013.01); *C22F 1/10* (2013.01)

(56) References Cited

U.S. PATENT DOCUMENTS

| | | | |
|---|---|---|---|
| 6,716,542 | B2 | 4/2004 | Uwazumi et al. |
| 8,568,576 | B2 | 10/2013 | Sato |
| 2001/0037938 | A1* | 11/2001 | Sato .................... C23C 14/3414 204/192.13 |
| 2003/0056928 | A1 | 3/2003 | Kubota et al. |
| 2006/0093868 | A1 | 5/2006 | Honda |
| 2007/0189916 | A1 | 8/2007 | Zhang |
| 2009/0134015 | A1 | 5/2009 | Racine et al. |
| 2009/0229976 | A1 | 9/2009 | Kato et al. |
| 2009/0242393 | A1 | 10/2009 | Satoh |
| 2010/0243435 | A1 | 9/2010 | Kato |
| 2011/0006243 | A1* | 1/2011 | Sasaki ................. C23C 14/0036 252/62.9 PZ |
| 2011/0243784 | A1* | 10/2011 | Yamamoto ................ B22F 8/00 419/19 |
| 2012/0118734 | A1 | 5/2012 | Sato et al. |
| 2012/0241317 | A1 | 9/2012 | Ikeda et al. |
| 2013/0168240 | A1 | 7/2013 | Ogino et al. |

FOREIGN PATENT DOCUMENTS

| | | |
|---|---|---|
| JP | 2001-76329 A | 3/2001 |
| JP | 2001-98360 A | 4/2001 |
| JP | 2004-014613 A | 1/2004 |
| JP | 2004-339586 A | 12/2004 |
| JP | 2006-45587 A | 2/2006 |
| JP | 2008-240011 A | 10/2008 |
| JP | 2009-1860 A | 1/2009 |
| JP | 2011-222086 A | 11/2011 |

* cited by examiner

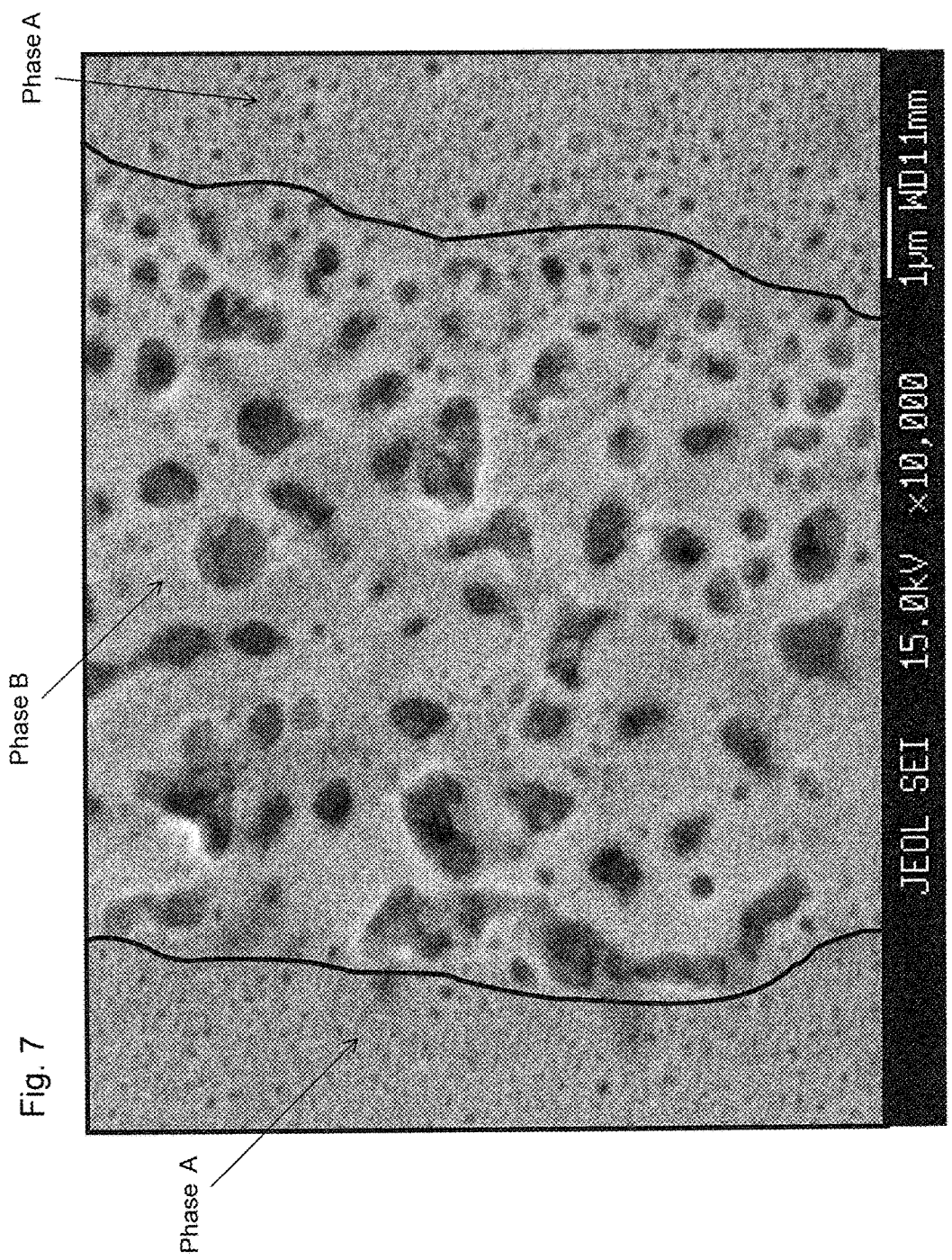

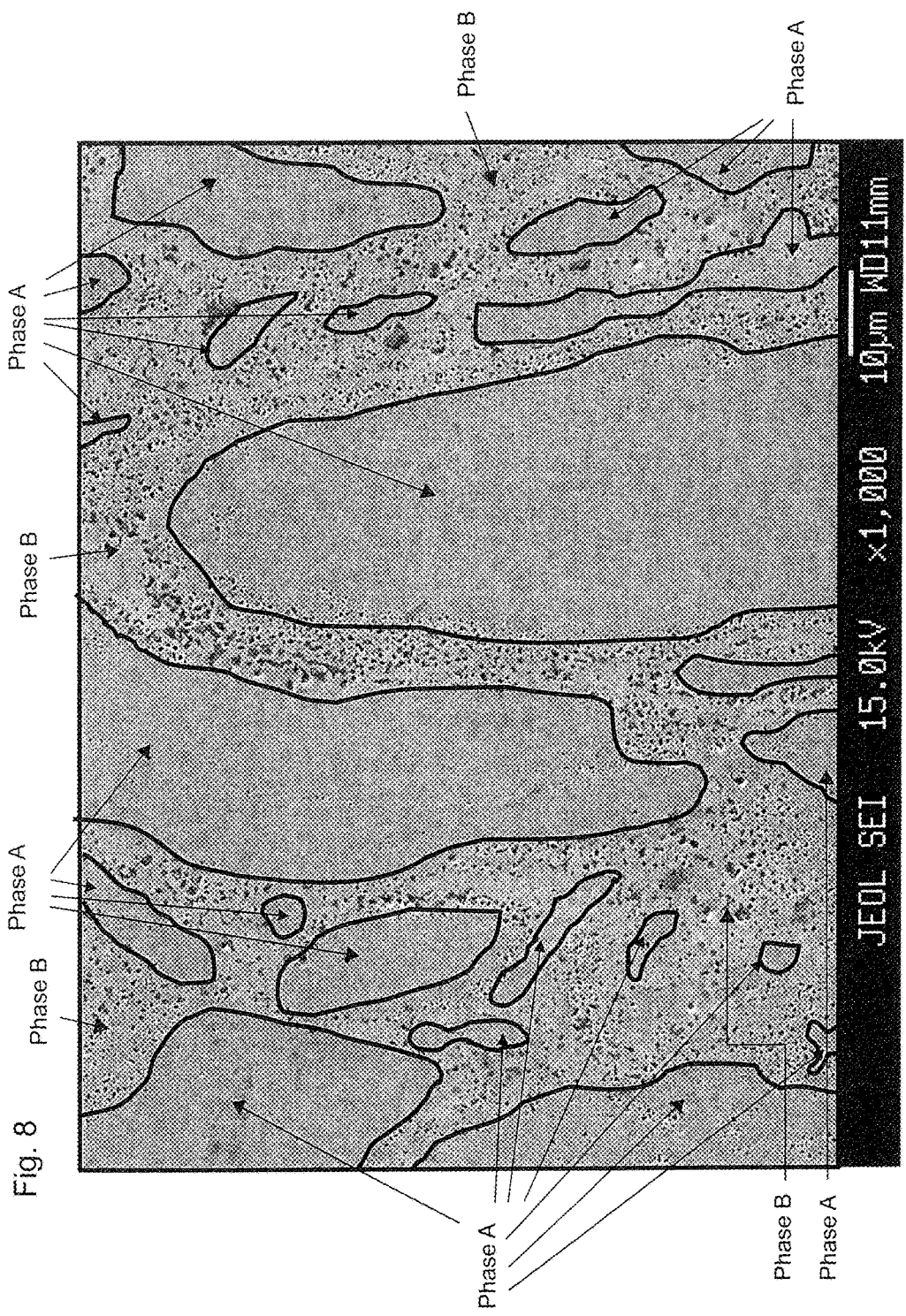

MAGNETIC MATERIAL SPUTTERING TARGET AND MANUFACTURING METHOD THEREOF

CROSS REFERENCE TO RELATED APPLICATIONS

This application is a continuation of co-pending U.S. application Ser. No. 14/358,285 which is a 371 National Stage of International Application No. PCT/JP2013/054849, filed Feb. 26, 2013, which claims the benefit under 35 USC 119 of Japanese Application No. 2012-059383, filed Mar. 15, 2012.

BACKGROUND

The present invention relates to a ferromagnetic sputtering target used for depositing a thin film in a magnetic recording medium, in particular, depositing a granular film on a magnetic recording medium for a hard disk in which the perpendicular magnetic recording system is used. The present invention also relates to a nonmagnetic grain-dispersed ferromagnetic sputtering target capable of suppressing discharge abnormalities of oxides that are the cause of particle generation during sputtering and a producing method thereof.

Although a wide variety of systems are available for a sputtering device, a magnetron sputtering device equipped with a DC power supply is widely used in view of high productivity to deposit the above magnetic recording films. The sputtering method refers to one in which a substrate serving as a positive electrode is placed facing a target which serves as a negative electrode, and high voltage is applied between the substrate and the target under an inert gas atmosphere to generate an electric field.

At this time, the inert gas is ionized to form plasma which comprises electrons and cations. When the cations in the plasma hit the surface of the target (the negative electrode), atoms which constitute the target are ejected. A film is formed when the ejected atoms adhere to the surface of the opposing substrate. The method employs the principle that a material which constitutes the target is deposited on the substrate by a series of these operations.

Meanwhile, referring to the development of magnetic materials, in the field of magnetic recording represented by hard disk drives, materials based on ferromagnetic metals such as Co, Fe or Ni are used as materials for magnetic thin films which serve for recording. For example, in recording layers of hard disks in which the longitudinal magnetic recording system is used, Co—Cr based or Co—Cr—Pt based ferromagnetic alloys having Co as a main component are used.

In addition, for recording layers of hard disks employing the perpendicular magnetic recording system which has been recently put in practical use, composite materials comprising a Co—Cr—Pt based ferromagnetic alloy having Co as a main component and a nonmagnetic inorganic substance are often used.

In many cases, a magnetic thin film in a magnetic recording medium such as a hard disk is produced by sputtering a ferromagnetic material sputtering target having the above materials as main components because of high productivity.

Methods of producing the foregoing ferromagnetic sputtering target include the dissolution method and the powder metallurgy method. Which methods may be used depends on required properties. But a sputtering target comprising a ferromagnetic alloy and grains of a nonmagnetic inorganic substance, which is used for recording layers for hard disks of the perpendicular magnetic recording system, is generally produced by the powder metallurgy method. This is because producing is difficult by the dissolution method since the grains of an inorganic substance need to be uniformly dispersed in the alloy base.

For example, a method of obtain a sputtering target for a magnetic recording medium is proposed, the method comprising: performing mechanical alloying on an alloy powder having a metal phase produced by the rapid solidification method and a powder for a ceramics phase to uniformly disperse the powder for a ceramics phase in the alloy powder; and performing molding by hot press (Japanese Patent Laid-Open No. H10-088333 A). In this case, the structure of the target shows an appearance where the base materials are connected in a form of soft roe (cod sperm), which are surrounded by $SiO_2$ (ceramics) (FIG. 2 of Japanese Patent Laid-Open No. H10-088333 A) or an appearance where the base materials are dispersed in a form of a thin string (FIG. 3 of Japanese Patent Laid-Open No. H10-088333 A). Other figures are assumed to show the similar structures although they are not clear. These structures have problems described below, and cannot be considered as a suitable sputtering target for a magnetic recording medium. Note that spherical materials shown in FIG. 4 of Japanese Patent Laid-Open No. H10-088333 A are of powder, and are not the structure of the target.

Further, even in a case where an alloy powder produced by the rapid solidification method is not used, a ferromagnetic sputtering target can be produced by preparing commercially available raw powders for each component which will constitute the target, weighing out the raw powders to obtain a desired composition, mixing by a known method such as ball milling, and molding and sintering the mixed powder by hot press.

For example, a method of obtaining a sputtering target for a magnetic recording medium is proposed, the method comprising: mixing a mixed powder obtained by mixing a Co powder, a Cr powder, a $TiO_2$ powder and a $SiO_2$ powder, with a Co spherical powder by a planetary mixer, molding the resulting powder mixture by hot press.

In this case, the structure of the target shows an appearance where there is a spherical phase (B) in a phase (A) in which grains of an inorganic substance are uniformly dispersed in the metal base (FIG. 1 of Japanese Patent Application No. 2010-011326). The structure as described above is suitable in terms of improving magnetic leakage flux, while in terms of suppressing particle generation during sputtering, it can hardly be considered as a suitable sputtering target for a magnetic recording medium.

In addition, a method of obtaining a sputtering target for forming a magnetic recording medium thin film is proposed, wherein the method comprising: mixing a Co—Cr binary alloy powder, a Pt powder and a $SiO_2$ powder, and hot pressing the resulting mixed powder (Japanese Patent Laid-Open No. 2009-001860 A).

In the structure of the target in this case, a Pt phase, a $SiO_2$ phase and a Co—Cr binary alloy phase were observed, and a dispersed layer was observed around a Co—Cr binary alloy layer although not shown in the figures. Such a structure as described above, it can hardly be considered as a suitable sputtering target for a magnetic recording medium.

Further to these described above, there are a few more proposals for developing a magnetic material. For example, a perpendicular magnetic recording medium having SiC and $SiO_x$ (x: 1 to 2) is proposed in Japanese Patent Laid-Open No. 2006-127621 A. Japanese Patent Laid-Open No. 2007-004957 A describes a magnetic material target containing Co, Pt, a first metal oxide, a second metal oxide and a third metal oxide.

Further, in Japanese Patent Laid-Open No. 2009-102707 A, proposed is a sputtering target comprising a Co—Pt matrix phase and a metal oxide phase having an average grain diameter of 0.05 μm or more and less than 7.0 μm. Also proposed is that controlling growth of crystal grains to obtain a target having low magnetic permeability and high density, thereby increasing deposition efficiency.

Furthermore, WO 2007/080781 A1 describes a nonmagnetic grain-dispersed ferromagnetic sputtering target in which a shape of a nonmagnetic material (smaller than a virtual circle having a radius of 2 μm) is defined with a material having ferromagnetic materials Co and Fe as main components and having a material selected from the group consisting of oxide, nitride, carbide and silicide.

Moreover, WO 2009/119812 A1 describes a nonmagnetic grain-dispersed ferromagnetic sputtering target in which nonmagnetic material grains comprising, oxides smaller than a virtual circle having a radius of 1 μm are dispersed in a Co—Cr alloy ferromagnetic material. It also describes a sputtering target in which the grain-diameter thereof is defined in detail. In addition, Japanese Patent Laid-Open No. 2001-076329 A describes a magnetic film having a granular structure.

As described above, for nonmagnetic grain-dispersed ferromagnetic sputtering targets such as a Co—Cr—Pt-oxide, use of $SiO_2$, $Cr_2O_3$ and $TiO_2$ as an oxide has been proposed, and defining a shape of the oxide has been further proposed. However, these oxides can cause abnormal electric discharge since they are insulators. Therefore, this abnormal electric discharge will pose a problem of particle generation during sputtering.

The amount of levitation of a magnetic recording head is becoming smaller every year as the recording density of HDD is improved. Therefore, the size and the number of particles permissible on magnetic recording medium are becoming even stricter. It is known that many of particles generated during the deposition of a granular film are oxides from the target. As one method of suppressing such particle generation, finely dispersing oxides in a target into a parent phase alloy appears to be effective.

In addition to Japanese Patent Laid-Open No. 2009-102707 A, WO 2007/080781 A1, and WO 2009/119812 A1 described above, a smaller grain size of a metal oxide is also proposed in WO 2009/054369 A1, Japanese Patent Laid-Open No. 2006-045587 A, Japanese Patent Laid-Open No. 2008-169464 A, Japanese Patent Laid-Open No. 2009-215617 A, Japanese Patent Laid-Open No. 2011-222086 A, Japanese Patent Laid-Open No. 2008-240011 A, Japanese Patent Laid-Open No. 2004-339586 A, Japanese Patent Laid-Open No. 2001-236643 A, Japanese Patent Laid-Open No. 2001-098360 A, and Japanese Patent Laid-Open No. H07-311929 A described below. That is, WO 2009/054369 A1 describes that an average grain diameter of grains formed in a metal oxide phase is 0.05 μm or more and less than 7.0 μm.

Japanese Patent Laid-Open No. 2006-045587 A describes that the grain diameter along the long axis of a ceramics phase is 10 μm or less. Japanese Patent Laid-Open No. 2008-169464 A describes that an oxygen-containing substance or an oxide phase is 50 μm or less. Japanese Patent Laid-Open No. 2009-215617 A describes that an average grain diameter of grains formed in an oxide phase is 3 μm or less. Japanese Patent Laid-Open No. 2011-222086 A describes that silica grains or titania grains satisfy 2≤Dp/Dn at a cross section perpendicular to the main surface of a sputtering target where Dn represents a grain diameter in the direction perpendicular to the main surface of the sputtering target, and Dp represents a grain diameter in the direction parallel to the above main surface. Japanese Patent Laid-Open No. 2008-240011 A describes that there are 500 chromium oxide aggregates present per $mm^2$.

Moreover, Japanese Patent Laid-Open No. 2004-339586 A describes that in a Co based alloy sputtering target containing silica, Cr or Pt, wherein the silica phase is in the range 0.5 to 5 μm and a hydrophobic silica powder can be used for manufacture. Japanese Patent Laid-Open No. 2001-236643 A describes a sputtering target used for producing a magnetic recording medium, wherein the grain diameters of oxides are 10 μm or less. Japanese Patent Laid-Open No. 2001-098360 A describes a Co—Cr—Pt—C based sputtering target, wherein an average crystal grain size in the matrix is 50 μm or less, and carbide is dispersed in the structure. Japanese Patent Laid-Open No. H07-311929 A describes a magnetic recording medium wherein crystal grains constituting a magnetic thin film are separated from a crystal grain boundary portion comprising a non-ferromagnetic non-metal phase. However, none of these grain-micronizing conditions are sufficient, and the demand for further improvement still remains at the present.

SUMMARY

In general, since nonmagnetic grain-dispersed ferromagnetic sputtering targets such as a Co—Cr—Pt oxide includes oxides therein such as $SO_2$, $Cr_2O_3$, $TiO_2$, $Ta_2O_5$, $CoO$, $Co_3O_4$ and $B_2O_3$ which are insulators, the oxides may become a cause for abnormal electric discharge. Therefore, this abnormal electric discharge will pose a problem of particle generation during sputtering.

In view of the above problem, the present invention aims to suppress abnormal electric discharge due to oxides and to reduce particle generation caused by abnormal electric discharge during sputtering. Although previous attempts to reduce the probability of abnormal electric discharge have been made by decreasing the grain diameter of oxides, a permissible particle level is becoming stricter as the recording density of a magnetic recording medium is improved. Accordingly, an object of the present invention is to provide a nonmagnetic grain-dispersed ferromagnetic sputtering target in which the dispersed state of oxides is further improved.

After conducting extensive studies in order to achieve the above objects, the present inventors find that a target in which abnormal electric discharge due to oxides does not occur during sputtering and particle generation is reduced can be obtained by adjusting the structure (oxide grain) of the target.

Based on these findings, the present invention provides an oxide-containing magnetic material sputtering target, wherein the oxides have an average grain diameter of 400 nm or less. The magnetic material sputtering target may comprise a Phase A in which the oxides have an average grain diameter of 400 nm or less, and a Phase B in which the oxides surrounding Phase A have an average grain diameter of 2 μm or less. The oxide-containing magnetic material sputtering target may have an oxide structure in which an average grain diameter is 400 nm or less and an aspect ratio is 2 or less. The oxide-containing magnetic material sputtering target may comprise a Phase A having an oxide structure in which an average grain diameter is 400 nm or less and the aspect ratio is 2 or less for a rectangular circumscribing an oxide grain to have an area thereof at the minimum, and a Phase B in which the oxides surrounding Phase A have an average grain diameter of 2 µm or less.

The magnetic material sputtering target may have a Cr content of 45 mol % or less (except 0 mol %) of Cr and a Co content. The magnetic material sputtering target may have a Cr content of 45 mol % or less (except 0 mol %), a Pt content of 1 mol % or more and 30 mol % or less, and a Co content. The magnetic material sputtering target may have a Pt content of 1 mol % or more and 30 mol % or less and a Co content. The magnetic material sputtering target may have a Pt content of 5 mol % or more and 60 mol % or less and an Fe content.

The magnetic material sputtering target may include, as an additive element, one or more elements selected from B, Ti, V, Mn, Zr, Nb, Ru, Mo, Ta, W, Ag, Au, Cu and C in an amount of 0.5 mol % or more and 20 mol % or less. The magnetic material sputtering target may have, as an oxide raw material, an oxide of one or more components selected from B, Si, Cr, Ti, Ta, W, Al, Mg, Mn, Ca, Zr, and Y in an amount of 1 to 20 mol %. The magnetic material sputtering target may have, as an additive material, an inorganic substance material having one or more components selected from carbon, nitride and carbide. HIP compaction treatment may be performed to the target material after hot pressing.

A method of producing an oxide-containing magnetic material sputtering target may comprise the steps of depositing a magnetic material on a substrate by PVD or CVD, removing the substrate from the deposited magnetic material, pulverizing the material to obtain a material for the target, and further sintering the raw material.

A method of producing an oxide-containing magnetic material sputtering target may comprise the steps of depositing a magnetic material on a substrate by PVD or CVD, removing the substrate from the deposited magnetic material, pulverizing the material to obtain a material for the target, further mixing the raw material with added insufficient components, and sintering the mixture.

A method of producing an oxide-containing magnetic material sputtering target may comprise the steps of depositing a magnetic material on a substrate by PVD or CVD, removing the substrate from the deposited magnetic material, and further performing hot isostatic pressing (HIP) on the resulting magnetic material.

A method of producing an oxide-containing magnetic material sputtering target may comprise the steps of depositing a magnetic material on a substrate by PVD or CVD, and removing the substrate from the deposited magnetic material to obtain a target. The method of producing an oxide-containing magnetic material sputtering target may comprise the step of removing the substrate from the deposited magnetic material, and laminating the obtained thin film to obtain a target.

According to the present invention, the structure of a ferromagnetic sputtering target, in particular the shape of oxide grains can be adjusted (micronized) to reduce contamination of impurities from a grinding device and a medium. Therefore, abnormal electric discharge due to oxides during sputtering will not occur, and particle generation can be reduced. Therefore, when the target of the present invention is used, stable electric discharge can be obtained during sputtering using magnetron sputtering equipment. Further, the following advantageous effects can be achieved: abnormal electric discharge due to oxides can be suppressed; particle generation during spattering caused by abnormal electric discharge can be reduced; and cost improvement can be achieved by improved yields.

BRIEF DESCRIPTION OF THE DRAWINGS

FIG. 7 shows an image (photograph) illustrating that Phase B of relatively large oxides is present at the grain boundary of Phase A of oxides in the Co—Pt—Ru—Cr—$SiO_2$—$TiO_2$—CoO based target in Example 2.

FIG. 8 shows an explanatory image illustrating that Phase B of relatively large oxides is present at the grain boundary of Phase A of oxides in the Co—Pt—Ru—Cr—$SiO_2$—$TiO_2$—CoO based target in Example 2.

DETAILED DESCRIPTION

Figure 1:
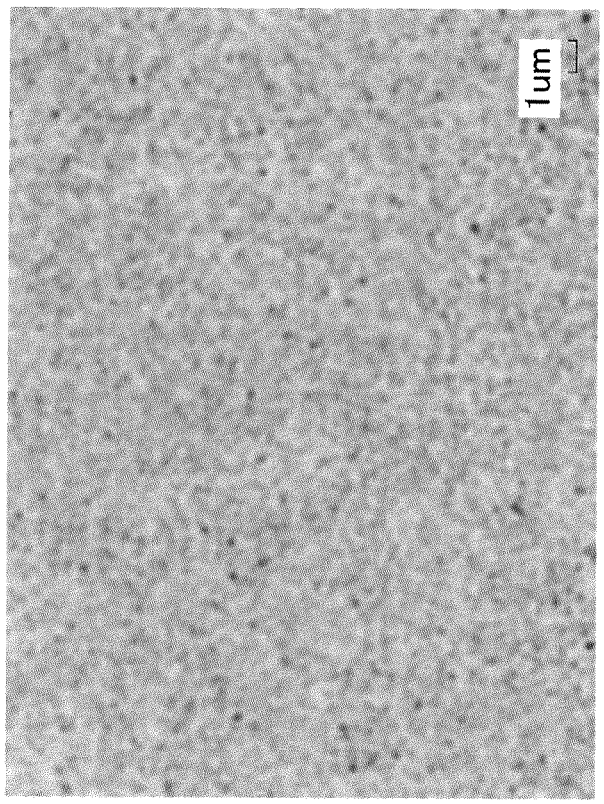
FIG. 1 shows images (photographs) illustrating the structure of the Co—Pt—Cr—$SiO_2$—$TiO_2$—$Cr_2O_3$ based target in Example 1.
Figure 1:
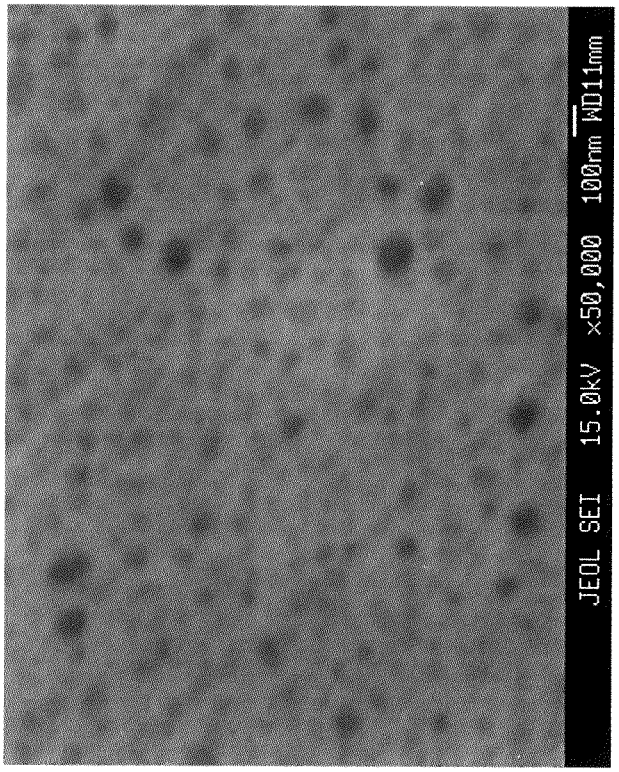

As the storage capacity of a hard disk drive is increasing, there has been a demand to reduce particles from a sputtering target when producing a hard disk medium in recent years. A sputtering target for perpendicular magnetic recording is commonly produced by powder sintering. In order to reduce particles, micronizing the structure of a sputtering target is very effective.

A sputtering target for perpendicular magnetic recording comprises a ferromagnetic material and a nonmetal material such as oxides and carbon. In order to suppress particles during sputtering, the metal and nonmetal need to be finely and uniformly dispersed. In order to achieve this, mechanically pulverizing and mixing raw powders together using a powerful ball mill and the like is one of the effective approaches. However, there are physical limitations in micronizing the structure by the current mechanical pulverization and mixing approaches, and therefore particle generation cannot be completely eliminated.

Accordingly, an ultrafine structure is achieved herein by using the vapor deposition methods instead of the conventional mechanical pulverization and mixing. The vapor deposition methods can include the PVD method (Physical Vapor Deposition) or the CVD method (Chemical Vapor Deposition).

In general, PVD and CVD are approaches for producing a thin film. In principle, these approaches involve decomposing a material to a molecular level, and then reconstituting it to form a thin film. Therefore, the thin film will have a structure which is far finer than that from mechanical pulverization and mixing. Therefore, the above problem can be solved by producing a sputtering target from a film obtained by the PVD and CVD approaches.

The oxide-containing magnetic material sputtering target of the present invention can be produced by depositing a magnetic material on a substrate by PVD or CVD, then removing the substrate from the deposited magnetic material, then pulverizing the resulting material to give a raw material for the target, and further sintering the raw material. Removing a substrate from a thin film which is deposited on the substrate in particular by the sputtering method or the vapor deposition method among PVD or CVD is effective to obtain a sputtering material.

They can be characterized by easiness of producing because they can be used for deposition in large-sized equipment, and can also produce a thickness of about 1000 µm. They have the following advantages: attendance is not required during deposition; further, the resulting sputtering material is almost free from contamination; and little contamination is introduced during pulverization because mechanical pulverization can be easily performed. Further when sintering, HIP compaction treatment after hot pressing is effective, but sintering conditions are not limited to this, and any can be used.

In some cases, a material pre-deposited on a substrate by PVD or CVD may not be consistent with a component composition of a magnetic material sputtering target to be produced. In this case, an oxide-containing magnetic material sputtering target can also be produced by pre-depositing a magnetic material having a similar component composition on a substrate, then removing the substrate from the deposited magnetic material, pulverizing the resulting material to give a raw material for the target, further adding an insufficient component to the raw material, and sintering the mixture.

The removal of the substrate after deposition as described above can be performed by mechanical removal or chemical dissolution removal or in appropriate combination thereof, but there is no particular limitation. Preferably, contamination of the sintering raw material with the substrate after removing the substrate can be controllable. Further, contamination with impurities can be significantly reduced even when a substrate material is similar or the same to a sintering material is used.

As a supplemental material to add insufficient materials, preferably fine grains similar to the sintering raw material are used; however, since they will account for a small amount of the sintering raw materials, it will not get much influence.

Upon sintering a supplemental material once pulverization is performed after recovering a vapor deposited film, a structure in which oxides larger than those within the vapor deposited film are dispersed may be seen at the grain boundary between the pulverized powders of the vapor deposited film. However, the presence of the oxides at the grain boundary of the vapor deposited film will not become a crucial problem, since the oxides at the grain boundary are small enough as compared with those mechanically pulverized and mixed though they are larger than those in the vapor deposited film; in addition, most of the sintered compact shows a fine structure such that these large grains will give not much influence.

While the above-mentioned method is steps in that magnetic material is deposited on a substrate by PVD or CVD, then the substrate is removed from the deposited magnetic material, and the resulting material is pulverized to obtain a raw material, it is also possible that hot isostatic pressing (HIP) may be performed on the thin film itself. Further, the substrate can be removed from the deposited magnetic material to obtain a target as it is. Furthermore, the substrate is removed from the deposited magnetic material, and the resulting thin films are laminated, which can be then subjected to press processing such as hot isostatic pressing (HIP) to give an oxide-containing magnetic material sputtering target.

The thin film and the laminated structure obtained as described above may have any thickness and any number of layers, respectively, which can be suitably determined depending on the material and the requirement. Further, an insufficient component may be added, and sintering can be performed to produce an oxide-containing magnetic material sputtering target. The present invention shall encompass all of them.

Thus, an oxide-containing magnetic material sputtering target can be obtained, which has an average grain diameter of 400 nm or less. This is a basic structure of the target which can be achieved by the present invention. It is also possible to obtain an oxide-containing magnetic material sputtering target, wherein the oxide-containing magnetic material sputtering target comprising Phase A in which the oxides have an average grain diameter of 400 nm or less and Phase B which surrounds the Phase A and contains oxides having an average grain diameter of 2 µm or less; further an oxide-containing magnetic material sputtering target having an oxide structure in which an average grain diameter is 400 nm or less, and the aspect ratio is 2 or less; and an oxide-containing magnetic material sputtering target comprising Phase A having an oxide structure in which an average grain diameter is 400 nm or less and the aspect ratio is 2 or less for a rectangular circumscribing an oxide grain to have an area thereof at the minimum and Phase B which surrounds the Phase A and contains oxides having an average grain diameter of 2 µm or less.

The above magnetic material sputtering targets may be a magnetic material sputtering target in which Cr is less than 45 mol % (except 0 mol %) and Co; a magnetic material sputtering target in which Cr is less than 45 mol % (except 0 mol %), and Pt is 1 mol % or more and 30 mol % or less and Co; and a magnetic material sputtering target in which Pt is 5 mol % or more and 60 mol % or less and Fe.

Further, the followings can be obtained: the above magnetic material sputtering target containing one or more elements selected from B, Ti, V, Mn, Zr, Nb, Ru, Mo, Ta, W, Ag, Au, Cu and C in an amount of 0.5 mol % or more and 20 mol % or less as an additive element; the above magnetic material sputtering target containing an oxide of one or more components selected from B, Si, Cr, Ti, Ta, W, Al, Mg, Mn, Ca, Zr and Y in an amount of 1 to 20 mol % as an oxide raw material; the above magnetic material sputtering target containing an inorganic material having one or more components selected from carbon, nitride and carbide as an additive material; and a magnetic material sputtering target in which HIP compaction treatment is performed after hot pressing.

The amounts of the above elements to be included merely show suitable numerical ranges in order to take advantage of the properties of a ferromagnetic material. Needless to say, any values which are not listed above can be used if desired. The present invention shall encompass all of them. The above amount of addition is effective amounts to show an effect of addition.

The resulting raw materials for sintering are weighed out to give a desired composition, and mixed and pulverized using a known approach such as a mortar and a ball mill. Raw powders to add as insufficient materials may be mixed at this stage. Further, there is no particular limitation for pulverizers and mixers, but a planetary mixer or a planetary stirring mixer can be preferably used. Moreover, when considering an issue of oxidation during mixing, mixing is preferably performed under an inert gas atmosphere or in vacuum.

In the present specification, described are Cr—Co alloy based magnetic materials, Cr—Pt—Co alloy based magnetic materials, Pt—Co alloy based magnetic materials, Pt—Fe alloy based magnetic materials which are typical as oxide-containing magnetic materials. The present invention is characterized by the shape of oxides present in a magnetic material and a producing method to obtain these special oxides (the form of presence). Therefore, it should be easily understood that the present invention can be similarly applied to other component systems such as Fe—Ni alloy based magnetic materials, Fe—Co alloy based magnetic materials, Fe—Ni—Co alloy based magnetic materials to obtain a similar effect. The present invention shall encompass all of them.

EXAMPLES

The Examples are now explained based on Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

A Co powder having an average grain diameter of 4 μm, a Cr powder having an average grain diameter of 5 μm and a Pt powder having an average grain diameter of 3 μm were prepared as metal raw powders, and a $TiO_2$ powder having an average grain diameter of 1 μm, a $SiO_2$ powder having an average grain diameter of 0.7 μm and a $Cr_2O_3$ powder having an average grain diameter of 1 μm were prepared as oxide powders. These powders were weighed at the following composition ratio to achieve 2000 g. The component composition is as follows.

Composition: 70Co-18Pt-3Cr-4$SiO_2$-2$TiO_2$-3$Cr_2O_3$ (mol %)

The weighed powders were sealed in a 10-litter ball mill pot along with tungsten alloy balls as grinding media, and rotated for 120 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-sputtering was performed at 2 kWhr, and thereafter, sputtering was performed on an Al substrate having a diameter of 6.5 inches to obtain a target thickness of 4000 μm. Then, the substrate was exfoliated from the sputter-deposited material, and hot isostatic pressing (HIP) was performed. The conditions of hot isostatic pressing were a rate of temperature increase at 300° C./h, a retention temperature of 950° C. and a retention time of 2 hours, and the gas pressure of Ar gas was gradually increased from the time of starting temperature increase, and pressurized at 150 MPa during retention at 950° C. After retention ended, it was kept in the furnace to allow natural cooling.

The sintered compact was ground with a surface grinder to give a disk-shaped target with a diameter of 164 mm and a thickness of 3 mm. Structure images of this target are shown in FIG. 1; and as shown in the figure, obtained is a Co—Pt—Cr—$SiO_2$—$TiO_2$—$Cr_2O_3$ based target having fine oxide grains with an average grain diameter of 60 nm. Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds.

The number of particles adhered on the substrate was measured with a particle counter, which was repeated 3 times in the same sputtering conditions. The average number of particles on the Si substrate in this case was 0.3 having a particle size of 0.17 μm to 0.25 μm, and 0 having a particle size of 0.25 to 3.0 μm.

The results are shown in Table 1. A target having such fine grains did not generate abnormal electric discharge due to oxides during sputtering, but enabled to reduce particle generation. Accordingly, stable electric discharge was obtained when sputtering was performed with magnetron sputtering equipment.

TABLE 1

| | Composition (mol %) | Hot Press Temp (° C.) | Grain Diameter After Film Pulverization (μm) | Film/Pulverized Powder Hot Press Temp (° C.) | HIP Temp (° C.) | Grain Diameter of Oxide (nm) | Particle 0.17 to 0.25 (μm) | Particle 0.25 to 3 (μm) |
|---|---|---|---|---|---|---|---|---|
| Example 1 | 70Co—18Pt—3Cr—4$SiO_2$—2$TiO_2$—3$Cr_2O_3$ | 1050 | — | — | 950 | 60 | 0.3 | 0 |
| Example 2 | 59Co—20Pt—5Ru—3Cr—5$SiO_2$—2$TiO_2$—6CoO | 1050 | 200 | 1000 | 1000 | 40 | 0.7 | 0.3 |
| Example 3 | 76Co—12Pt—5Cr—5$Ta_2O_5$—2$SiO_2$ | 1050 | 100 | 1000 | 1000 | 40 | 0.3 | 0.3 |
| Example 4 | 70Co—10Pt—12Cr—2$B_2O_3$—3$TiO_2$—2$SiO_2$—1CoO | 950 | 250 | 950 | 950 | 60 | 1 | 0.7 |
| Example 5 | 50Co—40Cr—10$TiO_2$ | 950 | 50 | 950 | 950 | 70 | 0.3 | 0 |
| Example 6 | 72Co—20Pt—3$SiO_2$—2$TiO_2$—3$Cr_2O_3$ | 1050 | — | — | 1100 | 400 | 3 | 1.3 |
| Example 7 | 85Co—5Pt—3Ru—2$SiO_2$—2$TiO_2$—3$Cr_2O_3$ | 1050 | 300 | 1000 | 1000 | 350 | 4 | 2 |
| Example 8 | 67.5Co—10Pt—12Cr—3B—6$SiO_2$—1.5$Cr_2O_3$ | 900 | 250 | 850 | 850 | 150 | 1.3 | 1 |
| Example 9 | 79Fe—5Pt—16$SiO_2$ | 1090 | 150 | 1000 | 1000 | 90 | 1 | 0.3 |
| Example 10 | 29Fe—55Pt—16$SiO_2$ | 1090 | 150 | 1000 | 1000 | 80 | 1.3 | 0.7 |
| Example 11 | 70Co—12Pt—12Cr—3$SiO_2$—2$TiO_2$—1$Cr_2O_3$ | 1050 | — | 1000 | 1000 | 60 | 0.3 | 0.3 |
| Example 12 | 79Co—10Pt—6Cr—1$Ta_2O_5$—4$SiO_2$ | 1050 | 200 | 950 | 950 | 10 | 0.3 | 0 |
| Comparative | 70Co—18Pt—3Cr—4$SiO_2$—2$TiO_2$—3$Cr_2O_3$ | 1050 | — | — | — | 1300 | 10.7 | 5.3 |

TABLE 1-continued

|  | Composition (mol %) | Hot Press Temp (° C.) | Grain Diameter After Film Pulverization (μm) | Film/Pulverized Powder Hot Press Temp (° C.) | HIP Temp (° C.) | Grain Diameter of Oxide (nm) | Particle 0.17 to 0.25 (μm) | Particle 0.25 to 3 (μm) |
|---|---|---|---|---|---|---|---|---|
| Example 1 |  |  |  |  |  |  |  |  |
| Comparative Example 2 | 59Co—20Pt—5Ru—3Cr—5SiO$_2$—2TiO$_2$—6CoO | 1050 | — | — | — | 1600 | 12.3 | 7.3 |
| Comparative Example 3 | 76Co—12Pt—5Cr—5Ta$_2$O$_5$—2SiO$_2$ | 1050 | — | — | — | 1000 | 12 | 4.7 |
| Comparative Example 4 | 70Co—10Pt—12Cr—2B$_2$O$_3$—3TiO$_2$—2SiO$_2$—1CoO | 950 | — | — | — | 1800 | 14.3 | 3.3 |
| Comparative Example 5 | 50Co—40Cr—10TiO$_2$ | 950 | — | — | — | 2300 | 8.7 | 3 |

Comparative Example 1

A Co powder having an average grain diameter of 4 μm, a Cr powder having an average grain diameter of 5 μm and a Pt powder having an average grain diameter of 3 μm were prepared as metal raw powders, and a TiO$_2$ powder having an average grain diameter of 1 μm, a SiO$_2$ powder having an average grain diameter of 0.7 μm and a Cr$_2$O$_3$ powder having an average grain diameter of 1 μm were prepared as oxide powders. The powders were weighed at the following composition ratio to achieve 2000 g. The component composition is as follows.

Composition: 70Co-18Pt-3Cr-4SiO$_2$-2TiO$_2$-3Cr$_2$O$_3$ (mol %)

The weighed powders were sealed in a 10-litter ball mill pot along with tungsten alloy balls as grinding media, and rotated for 100 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 164 mm and a thickness of 3 mm.

Figure 2:
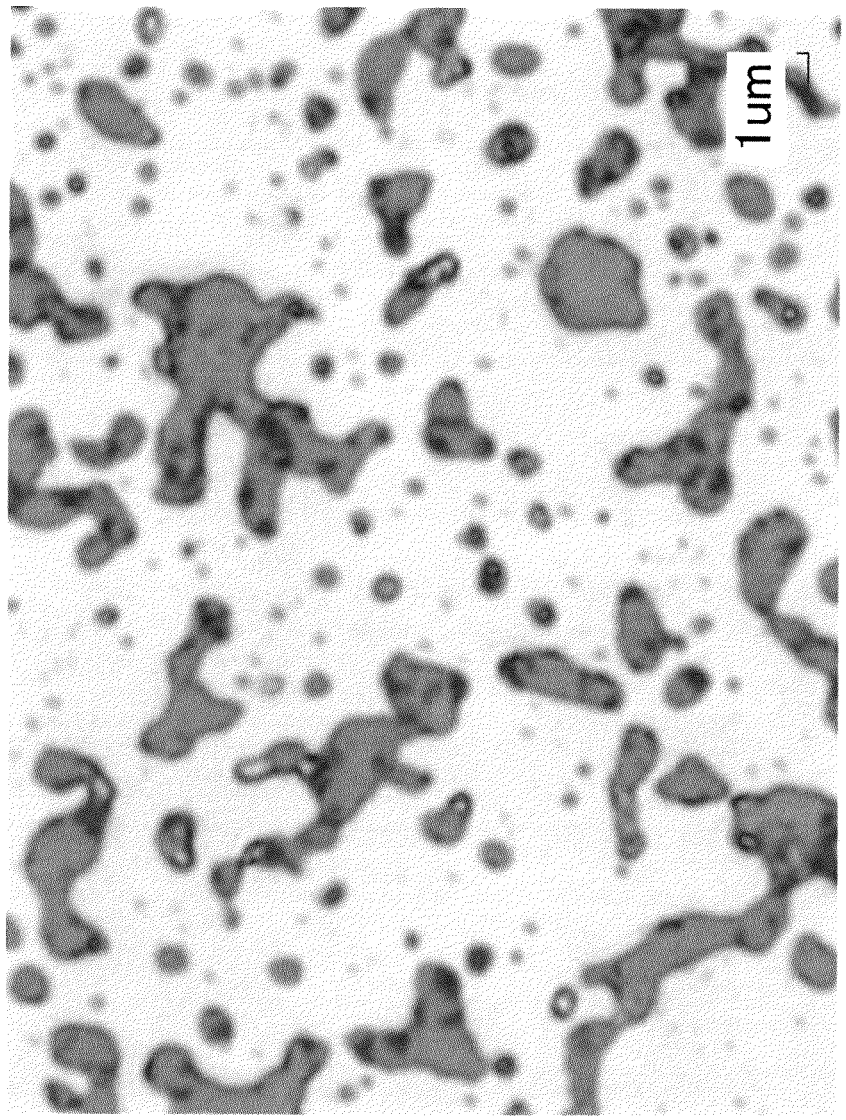
FIG. 2 shows an image (photograph) illustrating the structure of the Co—Pt—Cr—$SiO_2$—$TiO_2$—$Cr_2O_3$ based target in Comparative Example 1.

When the structure of this target was observed, it showed that an average grain diameter of oxide grains within a microscopic field was 1.3 μm. The structure of this target is shown in FIG. 2.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions. The average number of particles on the Si substrate in this case was 10.7 having a particle size of 0.17 μm to 0.25 μm, and 5.3 having a particle size of 0.25 to 3.0 μm, which showed an increase as compared with Example 1. The results are shown in Table 1.

Example 2

A Co powder having an average grain diameter of 4 μm, a Cr powder having an average grain diameter of 5 μm, a Pt powder having an average grain diameter of 3 μm and a Ru powder having an average grain diameter of 5 μm were prepared as metal raw powders; and a TiO$_2$ powder having an average grain diameter of 1 μm, a SiO$_2$ powder having an average grain diameter of 0.7 μm and a CoO powder having an average grain diameter of 1 μm were prepared as oxide powders. The powders were weighed at the following composition ratio to achieve 2000 g. The component composition is as follows.

Composition: 59Co-20Pt-5Ru-3Cr-5SiO$_2$-2TiO$_2$-6CoO (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, sputtering was performed on an Al substrate having a diameter of 6.5 inches to obtain a target thickness of 1000 μm.

Then, the substrate was exfoliated from the sputter-deposited material to recover a film, and the film was pulverized to obtain a fine powder having an average grain diameter of 200 μm. The steps of sputtering to pulverization and recovery were repeated for 4 times. The fine powder was filled in a carbon mold and hot pressed in a vacuum atmosphere under the following conditions: a temperature of 1000° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 1000° C., a retention time of 2 hours, and the gas pressure of Ar gas was gradually increased from the time of starting temperature increase, and pressurized at 150 MPa during retention temperature of 1000° C. After retention ended, it was kept in the furnace to allow natural cooling.

Figure 3:
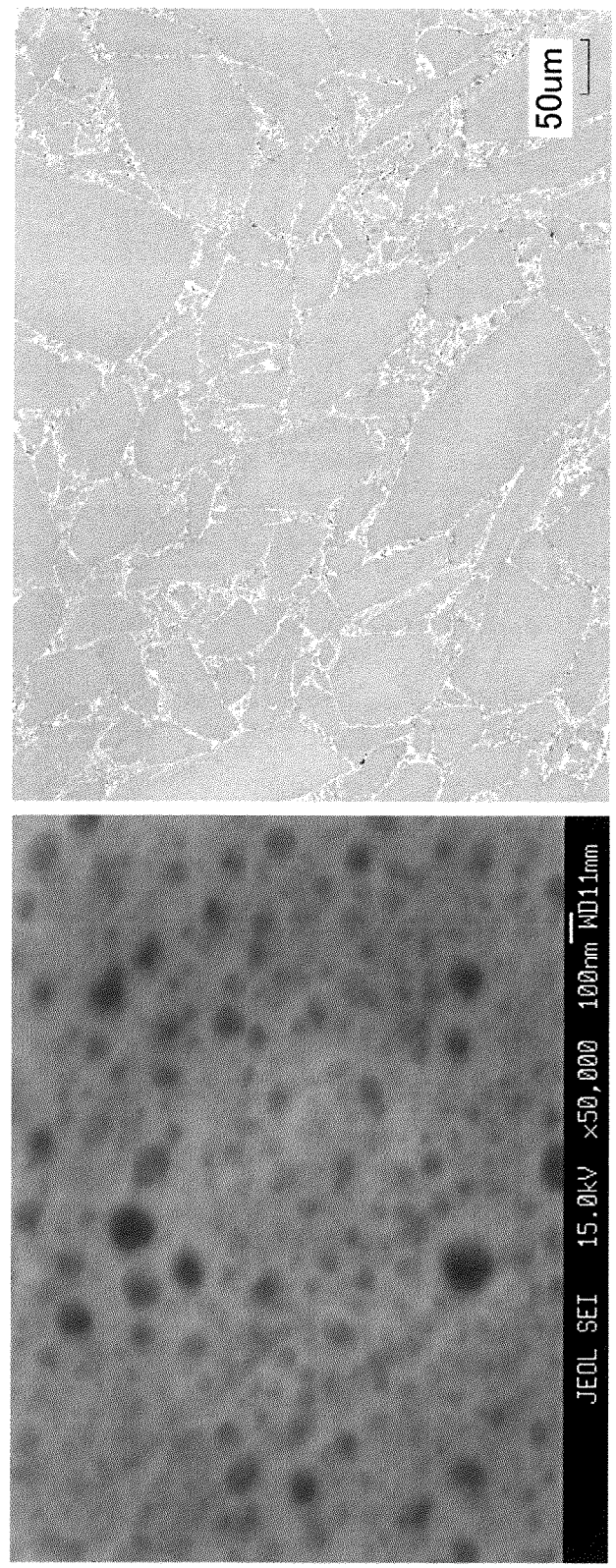
FIG. 3 shows images (photographs) illustrating the structure of the Co—Pt—Ru—Cr—$SiO_2$—$TiO_2$—CoO based target in Example 2.

The sintered compact was ground with a surface grinder to give a disk-shaped target with a diameter of 164 mm and a thickness of 3 mm. Structure images of this target are shown in FIG. 3. As shown in FIG. 3, a Co—Pt—Ru—Cr—SiO$_2$—TiO$_2$—CoO based target having fine oxide grains with an average grain diameter of 40 nm was obtained.

For reference, FIG. 7 (photograph) shows that Phase B of relatively large oxides is present at the grain boundary of Phase A of oxides. In addition, FIG. 8 shows an explanatory image. Note that FIG. 7 and FIG. 8 each show the structures observed at different places.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 0.7 having a particle size of 0.17 μm to 0.25 μm, and 0.3 having a particle size of 0.25 to 3.0 μm. The results are shown in Table 1. A target having such fine grains did not generate abnormal electric discharge due to oxides during sputtering, but enabled to reduce particle generation. Accordingly, stable electric discharge was obtained when sputtering was performed with magnetron sputtering equipment.

Comparative Example 2

A Co powder having an average grain diameter of 4 Atm, a Cr powder having an average grain diameter of 5 μm, a Pt powder having an average grain diameter of 3 μm and a Ru powder having an average grain diameter of 5 μm were prepared as metal raw powders, and a $TiO_2$ powder having an average grain diameter of 1 μm, a $SiO_2$ powder having an average grain diameter of 0.7 μm and a CoO powder having an average grain diameter of 1 μm were prepared as oxide powders. The powders were weighed at the following composition ratio to achieve 2000 g. The component composition is as follows.

Composition: 59Co-20Pt-5Ru-3Cr-5$SiO_2$-2$TiO_2$-6CoO (mol %)

Figure 4:
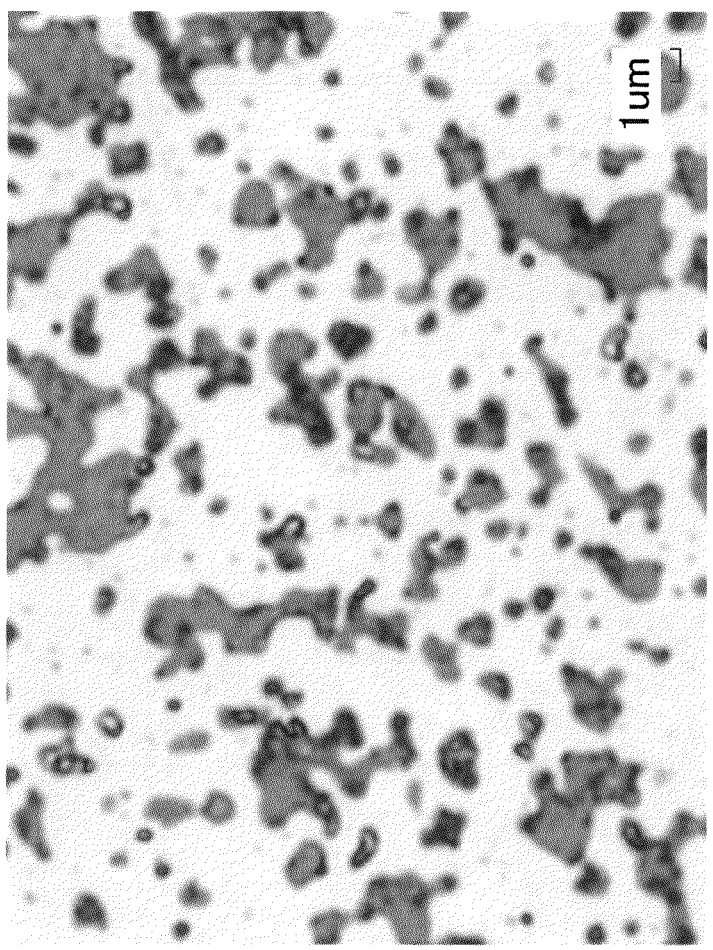
FIG. 4 shows an image (photograph) illustrating the structure of the Co—Pt—Ru—Cr—$SiO_2$—$TiO_2$—CoO based target in Comparative Example 2.

The weighed powders were sealed in a 10-litter ball mill pot along with zirconia balls as grinding media, and rotated for 100 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 164 mm and a thickness of 3 mm. When the structure of this target was observed, it showed that an average grain diameter of oxide grains within a microscopic field was 1.6 μm. The structure of this target is shown in FIG. 4.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 12.3 having a particle size of 0.17 μm to 0.25 μm, and 7.3 having a particle size of 0.25 to 3.0 μm, which showed an increase as compared with Example 2. The results are shown in Table 1.

Example 3

A Co powder having an average grain diameter of 4 μm, a Cr powder having an average grain diameter of 5 &m and a Pt powder having an average grain diameter of 3 μm were prepared as metal raw powders, and a $Ta_2O_5$ powder having an average grain diameter of 1 μm and a $SiO_2$ powder having an average grain diameter of 0.7 μm were prepared as oxide powders. The powders were weighed at the following composition ratio to achieve 2000 g. The component composition is as follows.

Composition: 76Co-12Pt-5Cr-5$Ta_2O_5$-2$SiO_2$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, sputtering was performed on an Al substrate having a diameter of 6.5 inches to obtain a target thickness of 1000 μm.

Then, the substrate was exfoliated from the sputter-deposited material to recover a film, and the film was pulverized to obtain a fine powder having an average grain diameter of 100 μm. The steps of sputtering to pulverization and recovery were repeated for 4 times. The fine powder was filled in a carbon mold, and hot pressed in a vacuum atmosphere under the following conditions: a temperature of 1000° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 1000° C., a retention time of 2 hours, and the gas pressure of Ar gas was gradually increased from the time of starting temperature increase, and pressurized at 150 MPa during retention temperature of 1000° C. After retention ended, it was kept in the furnace to allow natural cooling.

The sintered compact was ground with a surface grinder to give a disk-shaped target with a diameter of 164 mm and a thickness of 3 mm. A Co—Pt—Cr—$Ta_2O_5$—$SiO_2$ based target having fine oxide grains with an average grain diameter of 40 nm.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 0.3 having a particle size of 0.17 μm to 0.25 μm, and 0.3 having a particle size of 0.25 to 3.0 μm. The results are shown in Table 1.

A target having such fine grains did not generate abnormal electric discharge due to oxides during sputtering, but enabled to reduce particle generation.

Accordingly, stable electric discharge was obtained when sputtering was performed with magnetron sputtering equipment.

Comparative Example 3

A Co powder having an average grain diameter of 4 μm, a Cr powder having an average grain diameter of 5 μm and a Pt powder having an average grain diameter of 3 μm were prepared as metal raw powders, and a $Ta_2O_5$ powder having an average grain diameter of 1 μm and a $SiO_2$ powder having an average grain diameter of 0.7 μm were prepared as oxide powders. The powders were weighed at the following composition ratio to achieve 2000 g. The component composition is as follows.

Composition: 76Co-12Pt-5Cr-5$Ta_2O_5$-2$SiO_2$ (mol %)

The weighed powders were sealed in a 10-litter ball mill pot along with zirconia balls as grinding media, and rotated for 100 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 164 mm and a thickness of 3 mm. When the structure of this target was observed, it showed that an average grain diameter of oxide grains within a microscopic field was 1 μm.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions. The average number of particles on the Si substrate in this case was 12 having a particle size of 0.17 μm to 0.25 μm, and 4.7 having a particle size of 0.25 to 3.0 μm, which showed an increase as compared with Example 3. The results are shown in Table 1.

Example 4

A Co powder having an average grain diameter of 4 μm, a Cr powder having an average grain diameter of 5 μm and a Pt powder having an average grain diameter of 3 μm were prepared as metal raw powders, and a $B_2O_3$ powder having an average grain diameter of 10 μm, a $TiO_2$ powder having an average grain diameter of 1 μm, a $SiO_2$ powder having an average grain diameter of 0.7 μm and a CoO powder having an average grain diameter of 1 μm were prepared as oxide powders. The powders were weighed at the following composition ratio to achieve 2000 g. The component composition is as follows.

Composition: 70Co-10Pt-12Cr-2$B_2O_3$-3$TiO_2$-2$SiO_2$-1CoO (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 950° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1.2 kW and an Ar gas pressure of 1.5 MPa, and pre-spattering was performed at 2 kWhr, and thereafter, sputtering was performed on an Al substrate having a diameter of 6.5 inches to obtain a target thickness of 1000 μm. Then, the substrate was exfoliated from the sputter-deposited material to recover a film, and the film was pulverized to obtain a fine powder having an average grain diameter of 250 μm. The steps of sputtering to pulverization and recovery were repeated for 4 times. The fine powder was filled in a carbon mold and hot pressed in a vacuum atmosphere under the following conditions: a temperature of 950° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 950° C. and a retention time of 2 hours, and the gas pressure of Ar gas was gradually increased from the time of starting temperature increase, and pressurized at 150 MPa during retention at 950° C. After retention ended, it was kept in the furnace to allow natural cooling.

The sintered compact was ground with a surface grinder to give a disk-shaped target with a diameter of 164 mm and a thickness of 3 mm. A Co-10Pt-12Cr-2$B_2O_3$-3$TiO_2$-2$SiO_2$-1CoO based target having fine oxide grains with an average grain diameter of 60 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 1 having a particle size of 0.17 μm to 0.25 μm, and 0.7 having a particle size of 0.25 to 3.0 μm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Comparative Example 4

A Co powder having an average grain diameter of 4 μm, a Cr powder having an average grain diameter of 5 μm and a Pt powder having an average grain diameter of 3 μm were prepared as metal raw powders, and a $B_2O_3$ powder having an average grain diameter of 10 μm, a $TiO_2$ powder having an average grain diameter of 2 μm, a $SiO_2$ powder having an average grain diameter of 0.7 μm and a CoO powder having an average grain diameter of 1 μm were prepared as oxide powders. The powders were weighed at the following composition ratio to achieve 2000 g. The component composition is as follows.

Composition: 70Co-10Pt-12Cr-2B$_2$O$_3$-3TiO$_2$-2SiO$_2$-1CoO (mol %)

The weighed powders were sealed in a 10-litter ball mill pot along with zirconia balls as grinding media, and rotated for 100 hours for mixing. The resulting mixture was filled in a carbon mold, and hot pressed in a vacuum atmosphere under the following conditions: a temperature of 950° C., a retention time of 2 hours, and welding force of 30 MPa to obtain a sintered compact. The sintered compact was ground with a surface grinder to give a disk-shaped target with a diameter of 164 mm and a thickness of 3 mm. When the structure of this target was observed, it showed that an average grain diameter of oxide grains within a microscopic field was 1.8 μm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 14.3 having a particle size of 0.17 μm to 0.25 μm, and 3.3 having a particle size of 0.25 to 3.0 Atm, which showed an increase as compared with Example 4. The results are shown in Table 1.

Example 5

A Co powder having an average grain diameter of 4 μm and a Cr powder having an average grain diameter of 5 μm were prepared as metal raw powders, and a TiO$_2$ powder having an average grain diameter of 1 μm was prepared as an oxide powder. The powders were weighed at the following composition ratio to achieve 2000 g. The component composition is as follows.

Composition: 50Co-40Cr-10TiO$_2$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 950° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, sputtering was performed on a SUS substrate having a diameter of 6.5 inches to obtain a target thickness of 1000 μm.

Then, the substrate was exfoliated from the sputter-deposited material to recover a film, and the film was pulverized to obtain a fine powder having an average grain diameter of 50 μm. The steps of sputtering to pulverization and recovery were repeated for 4 times. The fine powder was filled in a carbon mold and hot pressed in a vacuum atmosphere under the following conditions: a temperature of 950° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 950° C. and a retention time of 2 hours, and the gas pressure of Ar gas was gradually increased from the time of starting temperature increase, and pressurized at 150 MPa during retention at 950° C. After retention ended, it was kept in the furnace to allow natural cooling.

Figure 5:
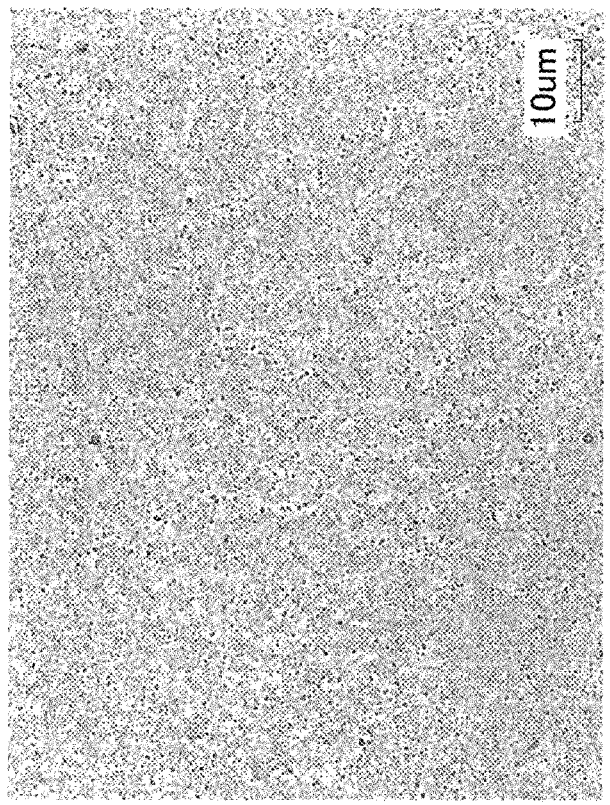
FIG. 5 shows images (photographs) illustrating the structure of the Co—Cr—$TiO_2$ based target in Example 5.
Figure 5:
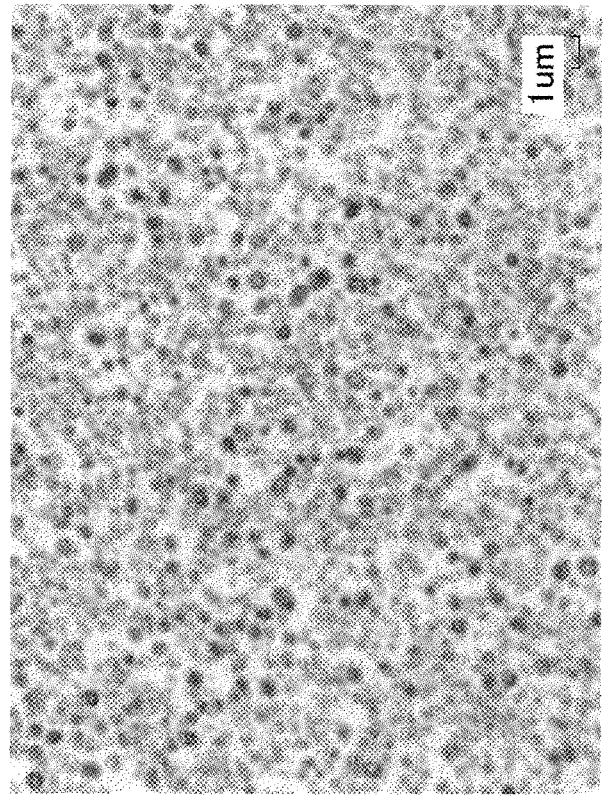

The sintered compact was ground with a surface grinder to give a disk-shaped target with a diameter of 164 mm and a thickness of 3 mm. Structure images of this target are shown in FIG. 5. As shown in FIG. 5, a Co-40Cr-10TiO$_2$ based target having fine oxide grains with an average grain diameter of 70 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 0.3 having a particle size of 0.17 μm to 0.25 μm, and 0 having a particle size of 0.25 to 3.0 rpm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Comparative Example 5

A Co powder having an average grain diameter of 4 μm and a Cr powder having an average grain diameter of 5 μm were prepared as metal raw powders, and a TiO$_2$ powder having an average grain diameter of 1 μm was prepared as an oxide powder. The powders were weighed at the following composition ratio to achieve 2000 g. The component composition is as follows.

Composition: 50Co-40Cr-10TiO$_2$ (mol %)

The weighed powders were sealed in a 10-litter ball mill pot along with zirconia balls as grinding media, and rotated for 100 hours for mixing. The resulting mixture was filled in a carbon mold, and hot pressed in a vacuum atmosphere under the following conditions: a temperature of 950° C., a retention time of 2 hours, and welding force of 30 MPa to obtain a sintered compact. The sintered compact was ground with a surface grinder to give a disk-shaped target with a diameter of 164 mm and a thickness of 3 mm. When the structure of this target was observed, it showed that an average grain diameter of oxide grains within a microscopic field was 2.3 μm.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 8.7 having a particle size of 0.17 µm to 0.25 µm, and 3 having a particle size of 0.25 to 3.0 µm, which showed an increase as compared with Example 5. The results are shown in Table 1.

Example 6

A Co powder having an average grain diameter of 4 µm and a Pt powder having an average grain diameter of 3 µm were prepared as metal raw powders, and a $SiO_2$ powder having an average grain diameter of 0.7 µm, a $TiO_2$ powder having an average grain diameter of 1 µm, and a $Cr_2O_3$ powder having an average grain diameter of 1 µm were prepared as oxide powders. The powders were weighed at the following composition ratio to achieve 2000 g. The component composition is as follows.

Composition: 72Co-20Pt-3$SiO_2$-2$TiO_2$-3$Cr_2O_3$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, sputtering was performed on an Al substrate having a diameter of 6.5 inches to obtain a target thickness of 4000 µm.

Then, the substrate was exfoliated from the sputter-deposited material, and hot isostatic pressing (HIP) was performed. The conditions for hot isostatic pressing were as follows: a rate of temperature increase at 300° C./h, a retention temperature of 1100° C. and a retention time of 2 hours, and the gas pressure of Ar gas was gradually increased from the time of starting temperature increase, and pressurized at 150 MPa during retention at 1100° C. After retention ended, it was kept in the furnace to allow natural cooling.

Figure 6:
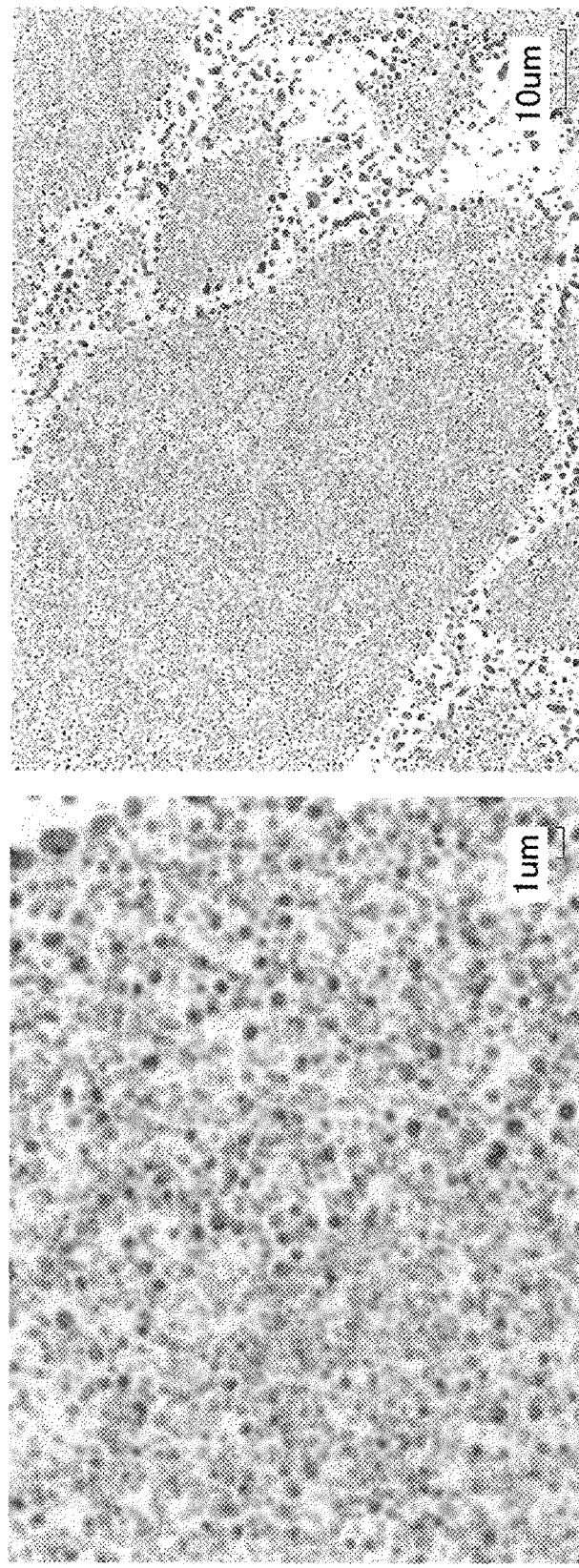
FIG. 6 shows images (photographs) illustrating the structure of the Co—Pt—$SiO_2$—$TiO_2$—$Cr_2O_3$ based target in Example 6.

The sintered compact was ground with a surface grinder to give a disk-shaped target with a diameter of 164 mm and a thickness of 3 mm. Structure images of this target are shown in FIG. 6. As shown in FIG. 6, a Co—Pt—$SiO_2$—$TiO_2$—$Cr_2O_3$ based target having fine oxide grains with an average grain diameter of 400 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 3 having a particle size of 0.17 µm to 0.25 µm, and 1.3 having a particle size of 0.25 to 3.0 µm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Example 7

A Co powder having an average grain diameter of 4 µm, a Pt powder having an average grain diameter of 3 µm and a Ru powder having an average grain diameter of 5 µm were prepared as metal raw powders, and a $SiO_2$ powder having an average grain diameter of 0.7 µm, a $TiO_2$ powder having an average grain diameter of 1 µm and a $Cr_2O_3$ powder having an average grain diameter of 1 µm were prepared as oxide powders. The powders were weighed at the following composition ratio to achieve 2000 g. The component composition is as follows.

Composition: 85Co-5Pt-3Ru-2$SiO_2$-2$TiO_2$-3$Cr_2O_3$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, sputtering was performed on an Al substrate having a diameter of 6.5 inches to obtain a target thickness of 1000 µm.

Then, the substrate was exfoliated from the sputter-deposited material to recover a film, and the film was pulverized to obtain a fine powder having an average grain diameter of 300 µm. The steps of sputtering to pulverization and recovery were repeated for 4 times. The fine powder was filled in a carbon mold and hot pressed in a vacuum atmosphere under the following conditions: a temperature of 1000° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 1000° C., a retention time of 2 hours, and the gas pressure of Ar gas was gradually increased from the time of starting temperature increase, and pressurized at 150 MPa during retention at 1100° C. After retention ended, it was kept in the furnace to allow natural cooling.

The sintered compact was ground with a surface grinder to give a disk-shaped target with a diameter of 164 mm and a thickness of 3 mm. A Co—Pt—Ru—$SiO_2$—$TiO_2$—$Cr_2O_3$ based target having fine oxide grains with an average grain diameter of 350 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 4 having a particle size of 0.17 μm to 0.25 μm, and 2 having a particle size of 0.25 to 3.0 μm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Example 8

A Co powder having an average grain diameter of 4 μm, a Cr powder having an average grain diameter of 5 μm, a Pt powder having an average grain diameter of 3 μm and a Co—B powder having an average grain diameter of 10 μm were prepared as metal raw powders, and a $SiO_2$ powder having an average grain diameter of 0.7 μm and a $Cr_2O_3$ powder having an average grain diameter of 1 μm were prepared as oxide powders. The powders were weighed at the following composition ratio to achieve 2000 g. The component composition is as follows.

Composition: $67.5Co-10Pt-12Cr-3B-6SiO_2-1.5Cr_2O_3$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 900° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, sputtering was performed on an Al substrate having a diameter of 6.5 inches to obtain a target thickness of 1000 μm.

Then, the substrate was exfoliated from the sputter-deposited material to recover a film, and the film was pulverized to obtain a fine powder having an average grain diameter of 250 μm. The steps of sputtering to pulverization and recovery were repeated for 4 times. The fine powder was filled in a carbon mold and hot pressed in a vacuum atmosphere under the following conditions: a temperature of 850° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 850° C. and a retention time of 2 hours, and the gas pressure of Ar gas was gradually increased from the time of starting temperature increase, and pressurized at 150 MPa during retention at 850° C. After retention ended, it was kept in the furnace to allow natural cooling.

The sintered compact was ground with a surface grinder to give a disk-shaped target with a diameter of 164 mm and a thickness of 3 mm. A Co—Pt—Cr—B—$SiO_2$—$Cr_2O_3$ target having fine oxide grains with an average grain diameter of 150 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 1.3 having a particle size of 0.17 μm to 0.25 μm, and 1 having a particle size of 0.25 to 3.0 μm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Example 9

An Fe powder having an average grain diameter of 5 μm and a Pt powder having an average grain diameter of 3 μm were prepared as metal raw powders, and a $SiO_2$ powder having an average grain diameter of 0.7 μm was prepared as an oxide powder. The powders were weighed at the following composition ratio to achieve 2000 g. The component composition is as follows.

Composition: $79Fe-5Pt-16SiO_2$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1090° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, sputtering was performed on an Al substrate having a diameter of 6.5 inches to obtain a target thickness of 1000 μm.

Then, the substrate was exfoliated from the sputter-deposited material to recover a film, and the film was pulverized to obtain a fine powder having an average grain diameter of 150 μm. The steps of sputtering to pulverization and recovery were repeated for 4 times. The fine powder was filled in a carbon mold and hot pressed in a vacuum atmosphere under the following conditions: a temperature of 1000° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 1000° C., a retention time of 2 hours, and the gas pressure of Ar gas was gradually increased from the time of starting temperature increase, and pressurized at 150 MPa during retention temperature of 1000° C. After retention ended, it was kept in the furnace to allow natural cooling.

The sintered compact was ground with a surface grinder to give a disk-shaped target with a diameter of 164 mm and a thickness of 3 mm. An Fe—Pt—$SiO_2$ based target having fine oxide grains with an average grain diameter of 90 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 1 having a particle size of 0.17 μm to 0.25 μm, and 0.3 having a particle size of 0.25 to 3.0 μm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Example 10

An Fe powder having an average grain diameter of 5 μm and a Pt powder having an average grain diameter of 3 μm were prepared as metal raw powders, and a $SiO_2$ powder having an average grain diameter of 0.7 μm was prepared as an oxide powder. The powders were weighed at the following composition ratio to achieve 2000 g. The component composition is as follows.

Composition: 29Fe-55Pt-16$SiO_2$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1090° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, sputtering was performed on an Al substrate having a diameter of 6.5 inches to obtain a target thickness of 1000 μm.

Then, the substrate was exfoliated from the sputter-deposited material to recover a film, and the film was pulverized to obtain a fine powder having an average grain diameter of 150 μm. The steps of sputtering to pulverization and recovery were repeated for 4 times. The fine powder was filled in a carbon mold and hot pressed in a vacuum atmosphere under the following conditions: a temperature of 1000° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 1000° C., a retention time of 2 hours, and the gas pressure of Ar gas was gradually increased from the time of starting temperature increase, and pressurized at 150 MPa during retention temperature of 1000° C. After retention ended, it was kept in the furnace to allow natural cooling.

The sintered compact was ground with a surface grinder to give a disk-shaped target with a diameter of 164 mm and a thickness of 3 mm. An Fe—Pt—$SiO_2$ based target having fine oxide grains with an average grain diameter of 80 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr, and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 1.3 having a particle size of 0.17 μm to 0.25 μm, and 0.7 having a particle size of 0.25 to 3.0 μm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Example 11

A Co powder having an average grain diameter of 4 μm, a Pt powder having an average grain diameter of 3 μm and a Cr powder having an average grain diameter of 5 μm were prepared as metal raw powders, and a $SiO_2$ powder having an average grain diameter of 0.7 μm, a $TiO_2$ powder having an average grain diameter of 1 μm and a $Cr_2O_3$ powder having an average grain diameter of 1 μm were prepared as oxide powders. The powders were weighed at the following composition ratio to achieve 2000 g. The component composition is as follows.

Composition: 70Co-12Pt-12Cr-3$SiO_2$-2$TiO_2$-1$Cr_2O_3$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, sputtering was performed on an Al substrate having a diameter of 6.5 inches to obtain a target thickness of 5 to 1000 μm.

Then, the substrate was exfoliated from the sputter-deposited material to recover a film. The steps from sputtering deposition to film recovery were repeated until the total thickness of the recovered films became 4000 μm. The recovered sheet-like thin films were laminated in a carbon mold, and hot pressed in a vacuum atmosphere under the following conditions: a temperature of 1000° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 1000° C., a retention time of 2 hours, and the gas pressure of Ar gas was gradually increased from the time of starting temperature increase, and pressurized at 150 MPa during retention temperature of 1000° C. After retention ended, it was kept in the furnace to allow natural cooling.

The sintered compact was ground with a surface grinder to give a disk-shaped target with a diameter of 164 mm and a thickness of 3 mm. A Co—Pt—Cr—$SiO_2$—$TiO_2$—$Cr_2O_3$ based target having fine oxide grains with an average grain diameter of 60 nm was obtained.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 0.3 having a particle size of 0.17 μm to 0.25 μm, and 0.3 having a particle size of 0.25 to 3.0 μm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

Example 12

A Co powder having an average grain diameter of 4 μm, a Cr powder having an average grain diameter of 5 μm and a Pt powder having an average grain diameter of 3 μm were prepared as metal raw powders, and a $Ta_2O_5$ powder having an average grain diameter of 1 μm and a $SiO_2$ powder having an average grain diameter of 0.7 μm were prepared as oxide powders. The powders were weighed at the following composition ratio to achieve 2000 g. The component composition is as follows:

Composition: 79Co-10Pt-6Cr-1$Ta_2O_5$-4$SiO_2$ (mol %)

The weighed powders were sealed in a 10-litter ball mill pot along with zirconia balls as grinding media, and rotated for 120 hours for mixing. The resulting mixture was filled in a carbon mold, and hot pressed in a vacuum atmosphere under the following conditions: a temperature of 1050° C., a retention time of 2 hours, and welding force of 30 MPa to obtain a sintered compact. The sintered compact was ground with a surface grinder to give a disk-shaped target with a diameter of 180 mm and a thickness of 6 mm.

Subsequently, the target was placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, sputtering was performed on an Al substrate having a diameter of 6.5 inches to obtain a target thickness of 1000 μm.

Then, the substrate was exfoliated from the sputter-deposited material to recover a film, and the film was pulverized to obtain a fine powder having an average grain diameter of 200 μm. The steps of sputtering to pulverization and recovery were repeated for 4 times. The fine powder was filled in a carbon mold and hot pressed in a vacuum atmosphere under the following conditions: a temperature of 950° C., a retention time of 2 hours, and welding force of 30 MPa to obtain a sintered compact.

Then, hot isostatic pressing (HIP) was performed. The conditions for hot isostatic pressing were as follows: a rate of temperature increase at 300° C./h, a retention temperature of 950° C. and a retention time of 2 hours, and the gas pressure of Ar gas was gradually increased from the time of starting temperature increase, and pressurized at 150 MPa during retention at 950° C. After retention ended, it was kept in the furnace to allow natural cooling.

The sintered compact was ground with a surface grinder to give a disk-shaped target with a diameter of 164 mm and a thickness of 3 mm. A Co—Pt—Cr—$Ta_2O_5$—$SiO_2$ based target having fine oxide grains with an average grain diameter of 10 nm.

Subsequently, the target was subjected to bonding on a Cu backing plate having a diameter of 180 mm and a thickness of 4 mm, and then placed in DC magnetron sputtering equipment to perform sputtering. The sputtering conditions were a sputtering power of 1 kW and an Ar gas pressure of 1.5 MPa, and pre-spattering was performed at 2 kWhr; and thereafter, deposition was performed on a Si substrate having a diameter of 4 inches at 1 kW for 200 seconds. The number of particles adhered on the substrate was measured with a particle counter, which was repeated 3 times in the same sputtering conditions.

The average number of particles on the Si substrate in this case was 0.3 having a particle size of 0.17 μm to 0.25 μm, and 0 having a particle size of 0.25 to 3.0 μm. The results are shown in Table 1.

A target having such fine grains did not generate abnormal electric discharge due to oxides during sputtering, but enabled to reduce particle generation. Accordingly, stable electric discharge was obtained when sputtering was performed with magnetron sputtering equipment.

According to the present invention, the structure of a ferromagnetic sputtering target, in particular, the shape of oxide grains can be adjusted (micronized) to reduce contamination of impurities from a grinding device and a medium. Therefore, abnormal electric discharge due to oxides during sputtering will not occur, and particle generation can be reduced. Thus, when the target of the present invention is used, stable electric discharge can be obtained during sputtering with a magnetron sputtering device. Further, it is useful as a ferromagnetic sputtering target used for deposition of a magnetic thin film in a magnetic recording medium, in particular, of a hard disk drive recording layer for the following excellent effects: abnormal electric discharge due to oxides can be suppressed; particle generation during sputtering caused by abnormal electric discharge can be decreased; and a cost reducing effect by higher yields can be obtained.

We claim:

1. A method of producing a magnetic material sintered sputtering target containing a dispersion of nonmagnetic oxide particles, comprising the steps of:
    depositing an oxide-containing magnetic material on a substrate by Physical Vapor Deposition (PVD) or Chemical Vapor Deposition (CVD) using a magnetic material and an oxide material as source raw materials,
    separating a deposit of the oxide containing magnetic material from the substrate,
    pulverizing the separated deposit of the oxide-containing magnetic material to obtain a powder thereof as a raw material for the sputtering target, and sintering the powder to form a sintered body of the oxide-containing magnetic material which is further machined and finished to form the sputtering target.

2. A method according to claim 1, further comprising the step of mixing the powder with added components to produce a mixture before said sintering step, wherein said step of sintering the powder includes sintering the mixture.

3. A method of producing a magnetic material sintered sputtering target containing a dispersion of nonmagnetic oxide particles, comprising the steps of:
  depositing an oxide-containing magnetic material on a substrate by Physical Vapor Deposition (PVD) or Chemical Vapor Deposition (CVD) using a magnetic material and an oxide material as source raw materials,
  separating a sheet of the oxide containing magnetic material from the substrate, and
  sintering the separated sheet of the deposit of the oxide-containing magnetic material to form a sintered body which is further machined and finished to form the sputtering target.

4. The method according to claim 3, wherein the depositing and separating steps are repeated to obtain a plurality of deposited and separated sheets which are laminated and subjected to the sintering step.

5. The method according to claim 4, wherein the sintering step includes hot pressing (HP) and hot isostatic pressing (HIP).

6. The method according to claim 3, wherein the sintering step includes hot isostatic pressing (HIP).

7. The method according to claim 3, wherein the sintering step includes hot pressing (HP) and hot isostatic pressing (HIP).

8. The method according to claim 3, wherein the non-magnetic oxide particles dispersed within the sputtering target have an average diameter of 400 nm or less and a shape characterized in an aspect ratio of 2 or less.

9. The method according to claim 1, wherein the sintering step includes hot pressing (HP) and hot isostatic pressing (HIP).

10. The method according to claim 1, wherein the non-magnetic oxide particles dispersed within the sputtering target have an average diameter of 400 nm or less and a shape characterized in an aspect ratio of 2 or less.

* * * * *